United States Patent
Shih et al.

(10) Patent No.: US 6,221,744 B1
(45) Date of Patent: Apr. 24, 2001

(54) METHOD FOR FORMING A GATE

(75) Inventors: Hsueh-Hao Shih; Juan-Yuan Wu, both of Hsinchu; Tri-Rung Yew, Hsinchu Hsien, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/234,618

(22) Filed: Jan. 20, 1999

(51) Int. Cl.$^7$ .................................................. H02L 21/305
(52) U.S. Cl. .......................... 438/585; 438/593; 438/595
(58) Field of Search .................................... 438/585, 587, 438/590, 592, 595

(56) References Cited

U.S. PATENT DOCUMENTS

| | | | |
|---|---|---|---|
| 5,710,454 | * | 1/1998 | Wu ........................................ 257/413 |
| 5,767,004 | * | 6/1998 | Balasubramanian et al. ........ 438/592 |
| 5,877,074 | * | 3/1999 | Jeng et al. ........................... 438/592 |

* cited by examiner

Primary Examiner—Carl Whitehead, Jr.
Assistant Examiner—Jeff Vockrodt
(74) Attorney, Agent, or Firm—Blakely Sokoloff Taylor & Zafman

(57) ABSTRACT

A method for forming a gate on a substrate for manufacturing semiconductor devices is described. The present method comprises the step of providing a gate oxide layer on top of a substrate. A polysilicon layer is overlaid on the gate oxide layer and then, a amorphous silicon layer is formed thereon. The stack of amorphous and polysilicon layers is defined to form a gate structure on gate oxide layer. Next, a thermal treatment is performed on the gate structure.

5 Claims, 1 Drawing Sheet

METHOD FOR FORMING A GATE

BACKGROUND OF THE INVENTION

1. Field of the Invention

This invention in general relates to a method for forming a gate on a substrate in manufacturing semiconductor devices and more particularly, to a method for forming a gate with a controlled critical dimension and good gate oxide quality.

2. Description of the Related Art

In conventional method for forming a gate on a substrate in manufacturing semiconductor devices, large-grain polysilicon is employed as a gate material. Because the surface of the layer formed by the large-grain polysilicon is very rough due to the size of the grain of the polysilicon, deep UV exposure light is scattered when the polysilicon layer is patterned to form gates. In this case, the critical dimension of the gate is difficult to control, the uniformity thereof cannot be obtained and therefore, a kink effect occurs.

As a resolution of the above problem encountered in the conventional method, employment of amorphous silicon as a gate material on a substrate for manufacturing semiconductor devices is proposed. Since the surface of the layer formed by the amorphous silicon is smoother than that of large-grain polysilicon, a good critical dimension and uniformity of the gate can be obtained. However, in the subsequent thermal processes, the amorphous silicon re-crystallizes at an elevated temperature to form large-grain polysilicon in, for example, cylindrical shapes. Because of the thus-formed large-grain polysilicon, a channeling effect occurs at the interface between the polysilicon gate and the gate oxide layer. This results in penetration of conductive ions, for example N-type ion dopants or P-type ion dopants, and especially boron ions, through the large-grain polysilicon into the gate oxide.

Therefore, it is desired that a method be developed for forming a gate on a substrate, which method can control the critical dimension of the gate and uniformity thereof and simultaneously eliminate the channeling effect between the gate and gate oxide thereon.

SUMMARY OF THE INVENTION

It is therefore an object of the present invention to provide a method for forming a gate on a substrate for manufacturing semiconductor devices to avoid the channeling effect at the interface between the gate oxide and the polysilicon layer.

It is another object of the present invention to provide a method for forming a gate with a controlled critical dimension and uniformity on a substrate for manufacturing semiconductor devices.

To achieve the above objects and other advantages of the present invention, a method for forming a gate on a substrate is described. The present method comprises the step of providing a gate oxide layer on top of a substrate. A polysilicon layer is overlaid on the gate oxide layer and next, an amorphous silicon layer is formed thereon. The amorphous silicon layer is defined to form a gate structure on gate oxide layer. Next, a thermal treatment is performed on the gate structure.

In accordance with one aspect of the present invention, a grain boundary exists between the polysilicon layer and the amorphous silicon layer so that the large-grain polysilicon having cylindrical shape is not formed at the elevated temperature necessary for the subsequent processes and thus, the channeling effect at the interface between the polysilicon gate and gate oxide on the substrate is avoided.

In accordance with another aspect of the present invention, a smooth top surface is provided by the amorphous silicon layer on the substrate, and the scattering of deep UV is thus avoided. Therefore, when defining the amorphous silicon layer to form a gate structure, the critical dimension of a gate is advantageously controlled and uniformity thereof can be obtained.

BRIEF DESCRIPTION OF THE DRAWINGS

Other objects, features, and advantages of the present invention will become apparent from the following detailed description of the preferred but non-limiting embodiments. The description is made with reference to the accompanying drawings in which.

DESCRIPTION OF THE PREFERRED EMBODIMENTS

Figure 1A:
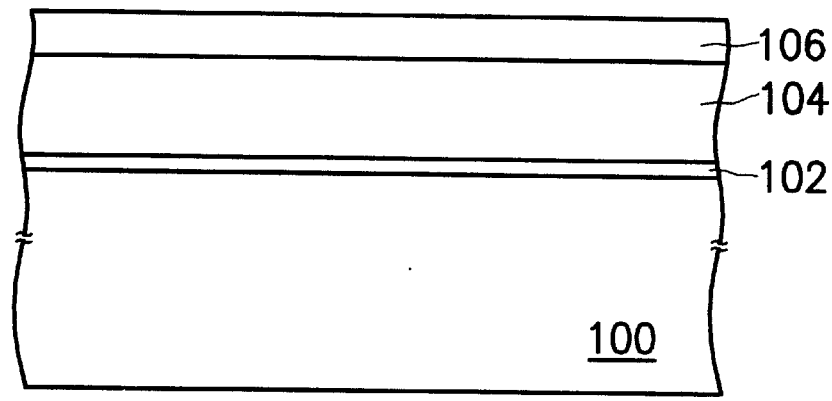
FIGS. 1A through 1C schematically illustrate in cross-sectional representation one preferred embodiment of this invention.
Figure 1B:
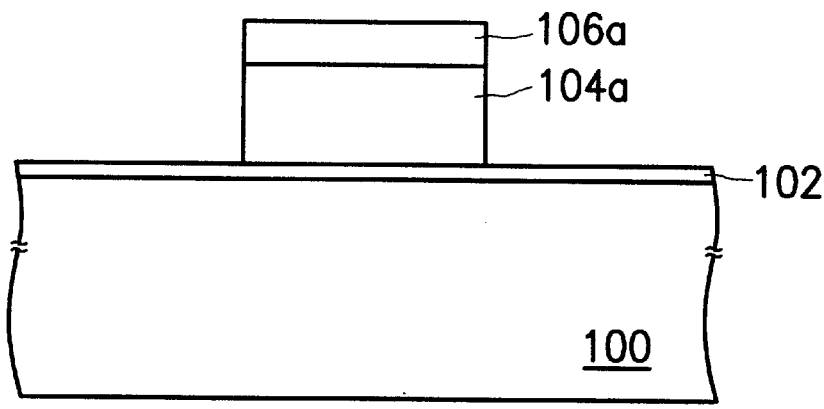
Figure 1C:
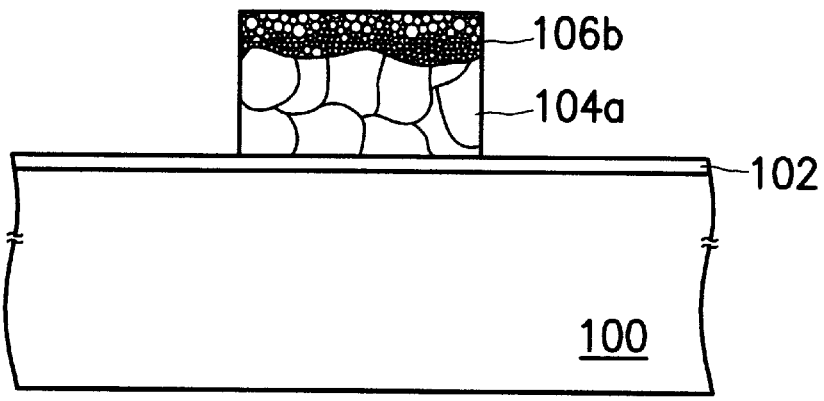

FIGS. 1A through 1C schematically illustrate in cross-sectional representation one preferred embodiment of the present method for forming a gate on a substrate.

Turning to FIG. 1A, a substrate 100, for example a silicon substrate, is provided with isolation structures (not shown in the drawings) designating an active area. A gate oxide layer 102 is formed on and covers the substrate 100 by, for example, a thermal oxidation process. Next, a polysilicon layer 104 is overlaid on top of the gate oxide layer 102 and then an amorphous silicon layer 106 is formed thereon. Both of these two layers can be formed by a low pressure chemical vapor deposition (LPCVD) or the like. The polysilicon layer 104 is formed at the temperature about 600° C. to about 680° C. with the gas of $SiH_4/H_2$ or $Si_2H_6/H_2$. The amorphous silicon layer 106 is formed at a temperature of about 550° C. to about 620° C. with a gas that is either $SiH_4/H_2$ or $Si_2H_6/H_2$. The thicknesses of the layers of polysilicon and amorphous silicon are respectively about 1000 Å to about 1500 Å and about 200 Å to about 1000 Å.

In a preferred embodiment for performance of the present method, the formation of the layers of polysilicon and amorphous silicon can be carried out in the same reaction chamber by modifying operation parameters, such as operation temperatures.

Alternatively, after the formation of the polysilicon layer on the gate oxide, the substrate can be taken out of the reaction chamber to modify the operation recipe for forming the amorphous silicon layer, after which the amorphous silicon layer is formed.

The polysilicon layer 104/amorphous silicon layer 106 are defined to form a stacked gate structure, as shown in FIG. 1B. Since a smooth top surface is provided by the amorphous silicon layer 106, the deep UV exposure light is not scattered during the formation of the gate structure. Therefore, the critical dimensions of the gate are advantageously controlled and uniformity thereof can be obtained. In such a case, the kink effect can be avoided.

In the present invention, the incorporation of the conductive ions into the gate comprising polysilicon layer 104a/amorphous silicon layer 106a can be obtained before or after defining the gate by ion implantation. The method for incorporation of the conductive ions is well known to artisans skilled in the related art, for example, deposition of the conductive ions with silicon or ion implantation of conductive ions after the definition of the gate structure. The conductive ions used in the present invention are N-type dopants such as $P^+$ or $As^+$, or P-type dopants such as $B^+$ or $BF_2^+$.

In FIG. 1C, the gate comprising polysilicon layer 104a/amorphous silicon layer 106a undergoes a thermal treatment, such as rapid thermal annealing process, for uniform dispersion of the conductive ions in the gate and recrystallization of the amorphous silicon 106a to improve the conductivity. During this process, the amorphous silicon 106a is converted into polysilicon grains with a reduced size 106b, as shown in FIG. 1C. Therefore, the gate structure formed by the present invention is composed of a stack of polysilicon having different grain sizes, and the grain size of polysilicon in the upper portion is smaller than that of the lower portion. In this circumstance, a grain boundary exists between the polysilicon layers 104a, 106b. Therefore, large grain polysilicon in a cylindrical shape is not formed in the amorphous silicon layer during the thermal treatment. The channeling effect at the interface between the polysilicon gate and gate oxide on the substrate is avoided.

While the invention has been particularly shown and described with reference to the preferred embodiment but not limited thereto, it is realized that other modifications and changes will be apparent to those skilled in the art. It is therefore to be understood that the appended claims are intended to cover all modifications and changes as fall within the true spirit and scope of the invention.

What is claimed is:

1. A method to form a gate on a semiconductor device substrate, comprising in the following order:

forming a gate oxide layer on the substrate;

forming a polysilicon layer on the gate oxide layer;

forming an amorphous silicon layer on the polysilicon layer, wherein the amorphous silicon layer includes grains defining a plurality of first sizes;

defining the amorphous silicon layer and the polysilicon layer to form a gate structure; and converting a first part of the grains of the amorphous silicon layer to polysilicon grains defining a plurality of second sizes so as to form a grain boundary between the amorphous silicon layer and the polysilicon layer, wherein each second size is smaller than the first size of the amorphous silicon layer grain.

2. The method of claim 1, further comprising:

incorporating conductive ions into the gate structure before defining the amorphous silicon layer and the polysilicon layer to form a gate structure; and uniformly dispersing the conductive ions within the gate structure.

3. The method of claim 2, wherein converting a first part of the grains and uniformly dispersing the conductive ions includes performing a thermal treatment on the gate structure.

4. The method of claim 3, wherein performing a thermal treatment on the gate structure includes performing a rapid thermal annealing process.

5. The method of claim 1 wherein forming an amorphous silicon layer on the polysilicon layer includes other than forming an undoped amorphous silicon layer on a highly doped polysilicon layer and wherein the polysilicon silicon layer is 1000 Å.

* * * * *